(12) United States Patent
Wang et al.

(10) Patent No.: US 12,098,478 B2
(45) Date of Patent: Sep. 24, 2024

(54) APPARATUS FOR PREPARING A SINGLE CRYSTAL COMPRISING A VOLATILIZATION CHAMBER AND A PLURALITY OF CRYSTAL PIECES FIXED BY COMBINED FIXTURES LOCATED IN A SOLID CONNECTION CHAMBER

(71) Applicant: THE 13TH RESEARCH INSTITUTE OF CHINA ELECTRONICS TECHNOLOGY GROUP CORPORATION, Hebei (CN)

(72) Inventors: Shujie Wang, Hebei (CN); Niefeng Sun, Hebei (CN); Yanlei Shi, Hebei (CN); Huimin Shao, Hebei (CN); Xiaolan Li, Hebei (CN); Yang Wang, Hebei (CN); Lijie Fu, Hebei (CN); Senfeng Xu, Hebei (CN); Jian Jiang, Hebei (CN); Huisheng Liu, Hebei (CN); Tongnian Sun, Hebei (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 0 days.

(21) Appl. No.: 17/415,962

(22) PCT Filed: Sep. 25, 2020

(86) PCT No.: PCT/CN2020/117571
§ 371 (c)(1),
(2) Date: Jun. 18, 2021

(87) PCT Pub. No.: WO2021/208363
PCT Pub. Date: Oct. 21, 2021

(65) Prior Publication Data
US 2022/0074073 A1 Mar. 10, 2022

(30) Foreign Application Priority Data

Apr. 17, 2020 (CN) .......................... 202020576918.1

(51) Int. Cl.
*C30B 35/00* (2006.01)
*C30B 33/06* (2006.01)

(52) U.S. Cl.
CPC .................................. *C30B 33/06* (2013.01)

(58) Field of Classification Search
CPC .... C30B 1/00; C30B 1/02; C30B 1/12; C30B 29/00; C30B 29/02; C30B 29/06;
(Continued)

(56) References Cited

U.S. PATENT DOCUMENTS

| 54,137 | A | * | 4/1866 | Field | ...................... | B21D 37/02 |
| | | | | | | 72/475 |
| 2005/0112281 | A1 | * | 5/2005 | Bhat | ...................... | C30B 25/02 |
| | | | | | | 427/248.1 |

FOREIGN PATENT DOCUMENTS

CN 104697331 A * 6/2015
EP 0102054 A1 * 7/1984

* cited by examiner

*Primary Examiner* — Kenneth A Bratland, Jr.
(74) *Attorney, Agent, or Firm* — Enable IP, P.C.

(57) ABSTRACT

Disclosed is an apparatus for preparing a large-size single crystal, which relates to the field of semiconductor material preparation, and more particularly, to an apparatus for preparing a large-size single crystal from a plurality of small-size single crystals by connecting them in solid states. The apparatus includes a hydrocooling furnace, a solid connection chamber hermetically disposed in the hydrocooling furnace, and combined fixtures provided in the solid connection chamber, wherein a plurality of crystal pieces are fixed by the combined fixtures, a top column or a stress block is used for pressing the crystal piece through the
(Continued)

combined fixtures, a heating wire surrounding the solid connection chamber is provided in the hydrocooling furnace, a vacuum tube is communicated with the solid connection chamber, and a thermocouple is disposed close to the combined fixtures. The present disclosure is advantageous in that: 1, single crystal pieces with a small size can be connected and prepared into a single crystal with a larger size, 2, in the preparation process, the problems in the conventional single crystal growth process, such as twinning and polycrystallization, can be excluded from consideration, 3, the equipment is simple, and 4, preparation of single crystals with any size is possible theoretically.

<div align="center">8 Claims, 2 Drawing Sheets</div>

(58) Field of Classification Search
CPC ......... C30B 29/08; C30B 29/10; C30B 29/40; C30B 29/403; C30B 29/406; C30B 29/42; C30B 29/44; C30B 31/00; C30B 31/06; C30B 31/08; C30B 31/10; C30B 33/00; C30B 33/06; C30B 35/00; C30B 35/002; B21J 9/00; B21J 9/02; B21J 13/00; B21J 13/02; B21J 13/04; B21J 13/06; B21J 13/08; B21J 17/00; B21J 17/02
USPC ........ 117/200–202, 204, 928, 930, 936–937, 117/953–955
See application file for complete search history.

APPARATUS FOR PREPARING A SINGLE CRYSTAL COMPRISING A VOLATILIZATION CHAMBER AND A PLURALITY OF CRYSTAL PIECES FIXED BY COMBINED FIXTURES LOCATED IN A SOLID CONNECTION CHAMBER

TECHNICAL FIELD

The present disclosure relates to the field of semiconductor material preparation, and more particularly, to an apparatus for preparing a large-size single crystal from a plurality of small-size single crystals by connecting them in solid states.

BACKGROUND ART

Compound semiconductor material, now an active field where countries compete vigorously, is a foundation for the development of the system of technologies in the electronic information industry, and is widely used in optical fiber communication, mobile communication, navigation, detection and other areas. A compound semiconductor single crystal substrate is the basis for preparing various electronic devices, the larger the size of the semiconductor single crystal, the lower the cost for preparing a device, hence the size of the semiconductor single crystal substrate reflects the competitiveness of the national semiconductor industry.

However, it would be more difficult to prepare a semiconductor single crystal substrate of a larger size with a conventional method, because this requires a larger size of a single crystal furnace, and higher stability and better symmetry of a temperature field for the growth of the single crystal, which is far too strict with instruments of equipment. Moreover, a larger size of a crucible is necessary, and the crucible has to endure an even higher temperature to create a temperature gradient, as a result, the crucible may end up with reduced strength and even pollute the melt when failing to withstand the high temperature. Besides, the energy use efficiency may be correspondingly reduced. Therefore, considering the equipment and consumables, we may find more problems in the way of infinitely increasing the volume of a furnace body, and the sizes of an insulator, a heater, and a crucible only.

Micro-defects such as dislocations and inclusions can seriously affect the quality and yield of subsequent devices. Twinning and polycrystallization in compound semiconductors are unacceptable macro-defects. Avoidance of dislocation is conflicted with the elimination of twinning and polycrystallization, because a lowered temperature gradient is necessary for avoiding dislocation but the lowered temperature gradient will increase the possibility of twinning and polycrystallization. Therefore, from the perspective of the growth of single crystals, it is also harder to produce large-sized single crystals with high quality and minimal defects.

SUMMARY OF THE INVENTION

It's an object of the present disclosure to solve the problems by providing a novel concept of preparing a large-size single crystal from a plurality of small-size single crystals by connecting them in solid states.

To achieve the above object, the technical solution devised herein is as follows, i.e., an apparatus for preparing a large-size single crystal, including a hydrocooling furnace, a solid connection chamber hermetically disposed in the hydrocooling furnace, and combined fixtures in the solid connection chamber.

A plurality of crystal pieces are fixed by the combined fixtures, and the crystal pieces are pressed through the combined fixture with a top column or a stress block.

A heating wire surrounding the solid connection chamber is provided in the hydrocooling furnace.

A vacuum tube is communicated with the solid connection chamber.

A thermocouple is provided close to the combined fixtures.

Further, to make use of single crystals of different shapes, two types of the combined fixtures are proposed, the first type includes two circular fixtures, where an inner surface of the circular fixture has an arc matched with the shape of the crystal piece, and the arc is smaller than 180°.

The second type includes two opposite groups of cubic fixtures for single crystals, where an inner surface of the cubic fixture for single crystals is a plane of which a length is smaller than a total length of the crystal pieces in combination.

Further, for connection under a volatile atmosphere, the solid connection chamber communicates with a volatilization chamber through a volatilization gas tube.

With the apparatus provided herein, a small single crystal is cut into single crystal pieces, and then single crystal pieces with like physical characteristics or similar in overall distribution and having high crystal orientation precision of a splicing surface are selected, where the splicing surface is subjected to orientation, polishing, acid washing and high-temperature vacuum treatment; the single crystal pieces are fixed with combined fixtures, the solid connection chamber and the hydrocooling furnace are selected according to different thermal physical characteristics of a semiconductor, so that a solid-state connection with high precision and high uniform physical characteristics is enabled between interfaces of the semiconducting single crystal pieces, and then the preparation of larger-sized single crystals is realized.

The present disclosure is advantageous in that: 1, single crystal pieces with a small size can be connected and prepared into a single crystal with a larger size, 2, in the preparation process, the problems in the conventional single crystal growth process, such as twinning and polycrystallization, can be excluded from consideration, 3, the equipment herein is simpler than a single crystal growth equipment, and 4, preparation of single crystals with any size is possible theoretically.

BRIEF DESCRIPTION OF THE DRAWINGS

In FIG. 1, 15 denotes a combination of single crystal pieces; 16 denotes a circular fixture; 17 denotes a base.

In FIG. 2, 18 denotes a cubic fixture for single crystal piece I; 19 denotes a cubic fixture for single crystal piece II; f denotes a pressing direction.

In FIG. 3, 20 denotes a hydrocooling furnace body I; 20-1 denotes a side cover of the furnace body I; 20-2 denotes a first flange of the furnace body I; 20-3 denotes a second flange of the furnace body I; 20-6 denotes a pressure gauge; 20-7 denotes a gas filling tube; 21 denotes a heating wire of the furnace body I; 22 denotes a body of a solid connection chamber I; 22-1 denotes a cap of the solid connection chamber I; 22-2 denotes a volatilization gas tube; 22-3 denotes a vacuum tube; 22-4 denotes a volatilization chamber; 23 denotes a stress block; 24 denotes an auxiliary heating wire; 25 denotes a volatile substance; 26 denotes a vacuum system I; 27 denotes a vacuum rubber hose; 28 denotes a vacuum valve I; 29 denotes a flange rubber ring; 30 denotes a horizontal load platform I; 31 denotes a thermocouple sealing ring; 32 denotes a thermocouple; 32-1 denotes a thermocouple protection tube.

In FIG. 4, 20-4 denotes a first connecting hole; 20-5 denotes a second connecting hole.

In FIG. 5, 22-5 denotes a built-in thermocouple tube I.

In FIG. 6, 17-1 denotes a base hole; 33 denotes a hydrocooling furnace body II; 33-1 denotes a left side cover of the furnace body II; 33-2 denotes a right side cover of the furnace body II; 33-3 denotes a thermocouple hole of the furnace body II; 34 denotes a body of a solid connection chamber II; 34-1 denotes a cap of the solid connection chamber II; 34-2 denotes a built-in thermocouple tube II; 35 denotes a heating wire of the furnace body II; 36 denotes a thermocouple ceramic tube of the furnace body II; 37 denotes a right hydrocooling flange; 37-1 denotes a right vacuum tube; 38 denotes a rubber ring; 39 denotes a right top column; 40 denotes a right vacuum valve; 41 denotes a right vacuum valve system; 42 denotes a right blind flange; 43 denotes a horizontal load platform II; 44 denotes a left top column; 45 denotes a left vacuum valve system; 46 denotes a left vacuum valve; 47 denotes a strain gauge; 48 denotes a left hydrocooling flange; 48-1 denotes a left vacuum tube; 49 denotes a left blind flange; 50 denotes a support; 51 denotes a thermocouple.

DETAILED DESCRIPTION OF THE INVENTION

An apparatus for preparing a large-size single crystal includes a hydrocooling furnace, a solid connection chamber hermetically disposed in the hydrocooling furnace, and combined fixtures provided in the solid connection chamber, wherein a plurality of crystal pieces are fixed by the combined fixtures, a top column or a stress block is used for pressing the crystal piece through the combined fixtures, a heating wire surrounding the solid connection chamber is provided in the hydrocooling furnace, a vacuum tube is communicated with the solid connection chamber, and a thermocouple is disposed close to the combined fixtures.

To match crystal pieces with different shapes, two types of combined fixtures are provided herein.

Figure 1:
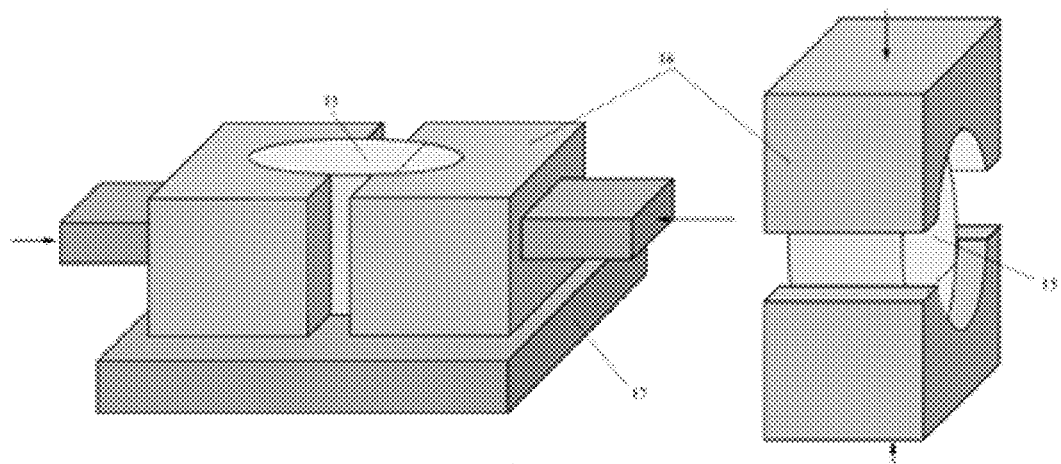
FIG. 1 is a view of circular combined fixtures for cylindrical single crystal pieces when assembled.

Referring to FIG. 1, the combined fixtures include two circular fixtures 16, the inner surface of which is an arc to match the shape of the crystal piece, where the arc is smaller than 180°. Such a combined fixture is matched with a single crystal piece with an arc shape. The arc of the circular fixture 16 is smaller than 180° because otherwise the two circular fixtures may contact and it then is not possible to apply pressure to the crystal piece through the fixture. An arrow indicates the direction of the applied pressure.

Figure 2:
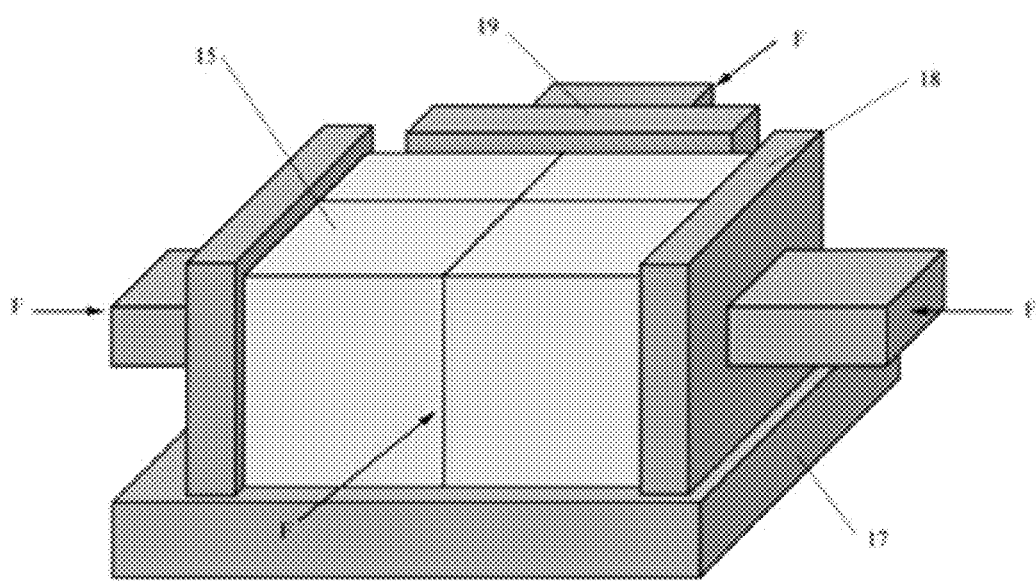
FIG. 2 is a view of combined cubic fixtures for single crystal pieces when assembled.

FIG. 2 shows combined fixtures matched with crystal pieces, including two opposite groups of cubic fixtures I18 and II19 for single crystals, the inner surface of the cubic fixture for single crystals is a plane, a length of the cubic fixture for single crystals is less than a total length of the crystal pieces in combination in case that the fixtures abut against each other and cannot apply pressure to the crystal pieces through the fixtures. An arrow indicates the direction in which the pressure F is applied. In the drawing, a cubic fixture II19 for single crystals is not shown to view the crystal pieces within the fixtures and splicing surfaces (represented by lines between the combined crystal pieces) between the crystal pieces.

The direction in which pressure is applied to the crystal pieces is perpendicular or nearly perpendicular to the splice surfaces between the crystal pieces.

Some semiconductor crystals have high-temperature volatility, such as InP, GaAs, GaP, InAs, and CdZnTe, and some do not have high-temperature volatility, such as Si, and Ge.

The following embodiments set forth apparatuses for connecting solid single crystal pieces designed for the two different types of semiconductor crystals described above.

Figure 6:
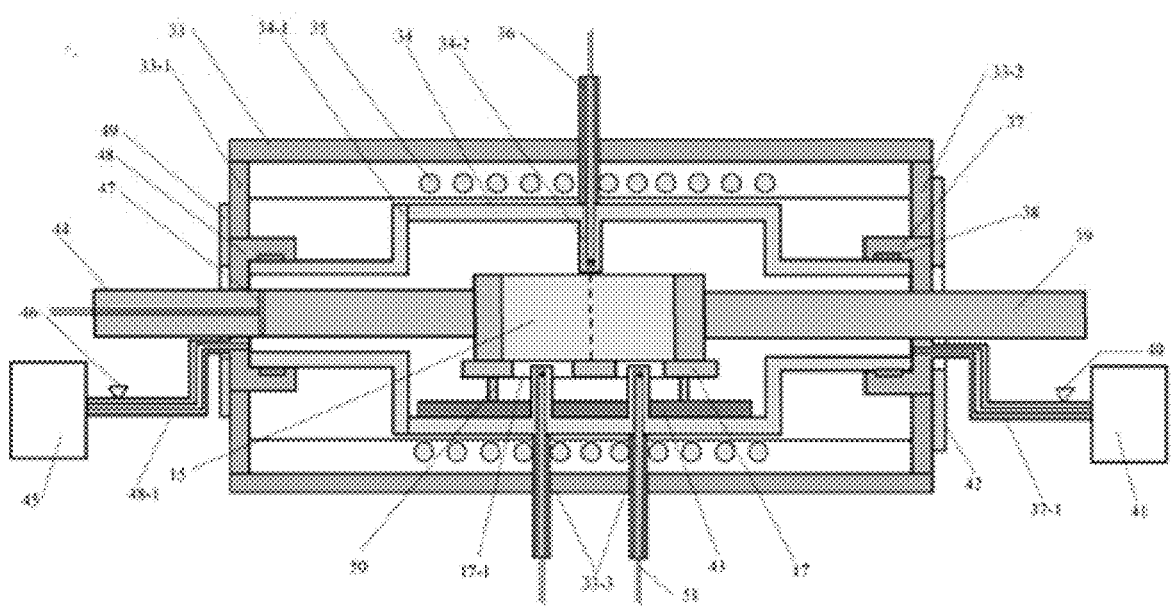
FIG. 6 is an apparatus for connecting solid bulk single crystal pieces of a high-temperature vacuum system.

In Embodiment 1, the solid connection of semiconductor crystals without high-temperature volatility is shown in FIG. 6.

The horizontal load platform II43 is placed in the body 34 of the solid connection chamber II and is adjusted to be horizontal.

A combination of single crystal pieces 15 is provided, with the splicing surfaces aligned. The combination is placed on the base 17 and assembled with the circular fixture 16 or with the cubic fixture I18 and the cubic fixture II19.

The assembled fixtures are placed on the horizontal load platform II43 of the body 34 of the solid connection chamber II. A support 50 is provided between the horizontal load platform II 43 and the base 17 for placing the combination of single crystal pieces 15 in the middle of the body 34 of the solid connection chamber II.

A cap 34-1 of the solid connection chamber II is welded to the body 34 of the solid connection chamber II.

A right hydrocooling flange 37 and a right top column 39 are assembled through a rubber ring 38, a left hydrocooling flange 48 and a left top column 44 are assembled through the rubber ring 38, the right hydrocooling flange 37 is assembled with a right hole of the body 34 of the solid connection chamber II, and then the left hydrocooling flange 48 is assembled with a left hole of the body 34 of the solid connection chamber II.

The above system is altogether loaded into the hydrocooling furnace body II33, with a base hole 17-1 ensure to be aligned with a thermocouple hole 33-3 of the furnace body II. A left blind flange 49 connects the left hydrocooling flange 48 with the hydrocooling furnace body II33; a right blind flange 42 connects the right hydrocooling flange 37 with the hydrocooling furnace body II33.

The above system is altogether loaded into the hydrocooling furnace body II33, with the base hole 17-1 aligned with thermocouple hole 33-3 of the furnace body II. The left blind flange 49 connects the left hydrocooling flange 48 and the left side cover 33-1 of the furnace body II with the hydrocooling furnace body II33; the right blind flange 42 connects the right hydrocooling flange 37 and the right side cover 33-2 of the furnace body II with the hydrocooling furnace body II33.

A thermocouple ceramic tube 36 of the furnace body II is assembled into the furnace body, and a thermocouple 51 is inserted into a built-in thermocouple tube II34-2 on the body 34 of the solid connection chamber II. Thermocouple ceramic tube 36 of the furnace body II passes through the hydrocooling furnace, the body 34 of the solid connection chamber II, the horizontal load platform II43 and the base 17 to reach the vicinity of the combined fixtures. Three thermocouples are shown, one above the combination of crystal pieces and two below the combination of crystal pieces. In practice, additional or fewer thermocouples may be provided as necessary.

A right vacuum tube 37-1 is connected to a right vacuum valve system 41, and a left vacuum tube 48-1 is connected to a left vacuum valve system 45.

The apparatus is assembled as described above.

In FIG. 6, if the combined fixtures employ two opposite groups of cubic features I18 and II19 for single crystal pieces, pressure can be applied in four directions. Only two directions are shown, and the other two directions may be implemented using the same structure.

A process control includes: opening a right vacuum valve 40 and a left vacuum valve 46, starting the vacuum system to vacuumize the solid connection chamber to 10-5 Pa, heating the system slowly to T1° C. through a heating wire 35 of the furnace body II for 0.5-10 hours, heating slowly to T2° C., applying pressure simultaneously to the combined fixtures through the right top column 39 and the left top column 44, feeding back a magnitude of a stress to which the single crystal piece is subjected through a strain gauge 47, and treating at a constant temperature and under a constant pressure for 0.5-20 hours; reducing the power of the heating wire 35 of the furnace body II slowly to cool the system, removing the pressures applied through the right top column 39 and the left top column 44, stopping vacuumizing, filling a gas to the standard atmospheric pressure; cooling to room temperature, sequentially opening the left blind flange 49, the right blind flange 42, the right hydrocooling flange 37, and the left hydrocooling flange 48, taking out and cutting the solid connection chamber II, and taking out the single crystals connected in the solid state.

T1 is 0.4 Tm to 0.6 Tm, T2 is 0.6 Tm to 0.9 Tm, and Tm is a melting point of a connected semiconductor material.

Figure 3:
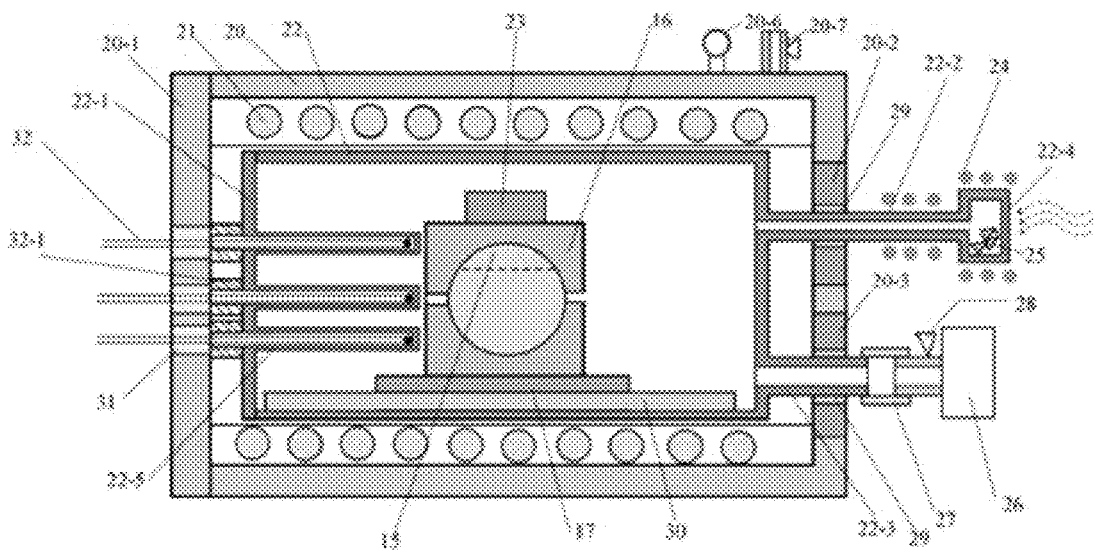
FIG. 3 is an apparatus for connecting solid bulk single crystal pieces containing a high-temperature volatile substance.
Figure 4:
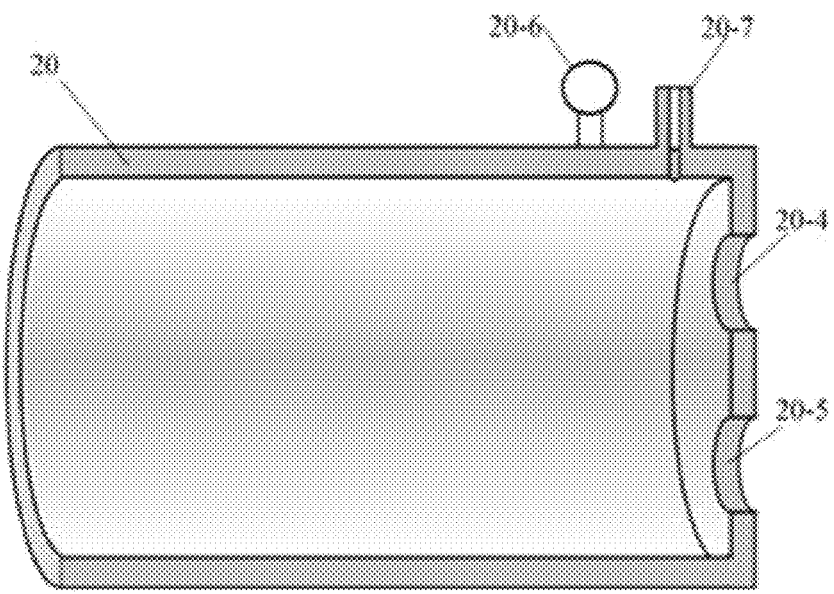
FIG. 4 is a schematic view of a structure of a hydrocooling furnace body of FIG. 3.
Figure 5:
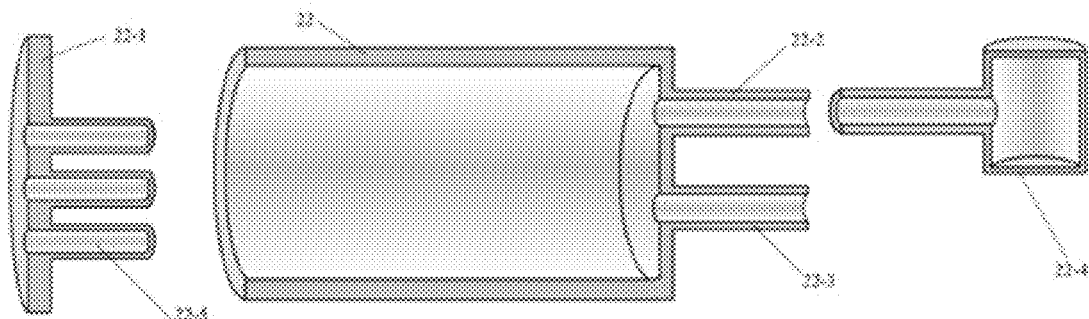
FIG. 5 is an exploded view of a solid connection chamber I of FIG. 3.

In Embodiment 2, the solid connection of semiconductor crystals with high-temperature volatility is shown in FIGS. 3 to 5.

The mass of a volatile substance 25 is calculated according to a designed processing temperature and a volume of the body 22 of the solid connection chamber I, and the volatile substance is loaded into the volatilization chamber 22-4.

A flange rubber ring 29 and a first flange 20-2 of the furnace body I are assembled (sleeved) on the volatilization gas tube 22-2, and then the volatilization chamber 22-4 is welded to be connected with the volatilization gas tube 22-2.

A weight of the stress block 23 is calculated according to the pressure required at the splicing surface, the single crystal pieces are combined and spliced into a cylindrical shape and fixed between two circular fixtures 16; the crystal pieces are combined and vertically placed, with the splicing surface being horizontal, and then loaded on the horizontal load platform 130 of the body 22 of the solid connection chamber I together with the base 17, where the stress block 23 is placed on the top of the circular fixture 16.

A cap 22-1 of the solid connection chamber I is welded to the body 22 of the solid connection chamber I.

A vacuum tube 22-3 is plugged with a rubber plug and filled with nitrogen or argon to the standard atmospheric pressure.

The body 22 of the solid connection chamber I is loaded into the hydrocooling furnace body I20, the vacuum tube 22-3 is inserted into a second connecting hole 20-5, and a second flange 20-3 of the furnace body I is used for connecting them both. Moreover, the flange rubber ring 29 and the first flange 20-2 of the furnace body I are assembled to the first connecting hole 20-4 of the body 20 of the hydrocooling furnace body I.

The side cover 20-1, connected with a thermocouple, of the furnace body I is connected to the hydrocooling furnace body I20; besides, a thermocouple protection tube 32-1 is provided, and a thermocouple 32 is loaded into a built-in thermocouple tube I22-5. A thermocouple sealing ring 31 seals the hydrocooling furnace.

The rubber plug is removed from the vacuum tube 22-3, and instantly the vacuum tube 22-3 is connected to the vacuum system I26 through a vacuum rubber hose 27 for vacuumization.

The apparatus is assembled as described above.

The embodiment shown in FIG. 3 is a design of a semiconductor with volatility. After the pressure is balanced inside the solid connection chamber I by the volatile substance 25, to prevent the solid connection chamber I from bursting due to the pressure imbalance, in this embodiment, a balancing gas is filled in through the gas filling tube 20-7 and creates pressure outside the solid connection chamber I. The pressure gauge 20-6 reads a pressure value.

The process control includes: vacuumizing to 10-5 Pa, heating the system slowly to a constant temperature of T1° C. with the heating wire 21 of the furnace body I, air-cooling the volatilization chamber 22-4, and heating for 0.5-10 hours after T1° C. is reached; closing a vacuum valve I28, heating slowly to T2° C., stopping air-cooling the volatilization chamber 22-4, and keeping heating the volatilization chamber 22-4 and the volatilization gas tube 22-2 with an auxiliary heating wire 24 until volatilization is complete; keeping the temperature of the body 22 of the solid connection chamber I at T2, keeping it constant for 0.5-20 hours, and reducing the power of the heating wire 21 of the furnace body I and the auxiliary heating wire 24 to cool the system to room temperature; reducing the pressure of the hydrocooling furnace body I 20, sequentially opening the side cover 20-1 of the furnace body I, the first flange 20-2 of the furnace body I, and the second flange 20-3 of the furnace body I, taking out and cutting the solid connection chamber I, and and taking out the single crystals connected in the solid state.

T1 is 0.4 Tm to 0.6 Tm, T2 is 0.6 Tm to 0.9 Tm, and Tm is a melting point of a connected semiconductor material.

The above two embodiments are intended to illustrate the technical solution of the present disclosure and not to limit the scope thereof, and all other apparatuses obtained through combinations of different combined fixtures, solid connection chambers and hydrocooling furnace bodies as necessary fall within the scope of the present disclosure without departing from the spirits of the technical solution herein.

The invention claimed is:

1. An apparatus for preparing a large-size single crystal, characterized by comprising a hydrocooling furnace, a solid connection chamber hermetically disposed in the hydrocooling furnace, and combined fixtures in the solid connection chamber, a plurality of crystal pieces are fixed by the combined fixtures, a stress block placed in the solid connection chamber is used for pressing the crystal pieces through the combined fixtures, a heating wire surrounding the solid connection chamber is provided in the hydrocooling furnace, a vacuum tube is communicated with the solid connection chamber, thermocouples are disposed above and below the combined fixtures; and a volatilization chamber is communicated with the solid connection chamber through a volatilization gas tube, the volatilization chamber configured to load a volatile substance, wherein the stress block has a weight sufficient to generate a pressure required at a splicing surface of the plurality of crystal pieces.

2. The apparatus according to claim 1, characterized in that the combined fixtures comprise two circular fixtures, where an inner surface of each of the circular fixtures has an arc matched with the shape of the crystal piece, and the arc of each of the circular fixtures is smaller than 180°.

3. The apparatus according to claim 2, characterized in that the combined fixtures are vertically placed, and the stress block is placed on an upper circular fixture.

4. The apparatus according to claim 1, characterized in that the combined fixtures comprise two opposite groups of cubic features I and II for single crystal pieces, where an inner surface of a cubic fixture for single crystals is a plane of which a length is smaller than a total length of the crystal pieces in combination.

5. The apparatus according to claim 1, characterized in that the hydrocooling furnace comprises a hydrocooling furnace body II, a left side cover of the furnace body II, and a right side cover of the furnace body II, the solid connection chamber comprises a body of the solid connection chamber II and a cap of the solid connection chamber II, where the body of the solid connection chamber II and the cap of the solid connection chamber II enclose an inner cavity, the hydrocooling furnace and the solid connection chamber are connected through a right hydrocooling flange and a left hydrocooling flange, the combined fixtures in the solid connection chamber are pressed by a right top column and a left top column, and the right and left top columns are positioned by the right and left hydrocooling flanges, respectively.

6. The apparatus according to claim 1, characterized in that the hydrocooling furnace comprises a hydrocooling furnace body I and a side cover (20-1) of the hydrocooling furnace body I, a first flange of the hydrocooling furnace body I for positioning the volatilization gas tube is provided in a first connecting hole, and a second flange of the hydrocooling furnace body I for positioning a vacuum tube is provided in a second connecting hole, the solid connection chamber comprises a body of the solid connection chamber I and a cap of the solid connection chamber I, where the body of the solid connection chamber I and the cap of the solid connection chamber I enclose an inner cavity.

7. The apparatus according to claim 1, characterized in that the hydrocooling furnace is further provided with a gas filling tube with a valve.

8. The apparatus according to claim 1, characterized in that an auxiliary heating wire is provided around the volatilization chamber and the volatilization gas tube.

* * * * *